United States Patent [19]

Allen, Jr. et al.

[11] 4,315,225
[45] Feb. 9, 1982

[54] HEAT SINK LASER DIODE ARRAY

[75] Inventors: Louis B. Allen, Jr., Florissant; Herbert G. Koenig, Jr., St. Charles; Danny D. Meyer, St. Louis, all of Mo.

[73] Assignee: McDonnell Douglas Corporation, St. Louis, Mo.

[21] Appl. No.: 69,311

[22] Filed: Aug. 24, 1979

[51] Int. Cl.³ .............................................. H01S 3/19
[52] U.S. Cl. ..................................... 372/35; 357/81; 372/36
[58] Field of Search ................... 351/94.5 H, 94.5 P; 357/18, 81

[56] References Cited

U.S. PATENT DOCUMENTS

| | | | |
|---|---|---|---|
| 3,303,432 | 2/1967 | Garfinkel et al. | 331/94.5 H |
| 3,351,698 | 11/1967 | Marinace | 357/81 |
| 3,538,455 | 11/1970 | Florio | 331/94.5 PE |
| 3,555,452 | 1/1971 | Nielsen et al. | 331/94.5 H |
| 3,603,381 | 9/1971 | Scherbaum et al. | 357/81 |
| 3,686,543 | 8/1972 | Nyul | 331/94.5 H |
| 3,835,414 | 9/1974 | Ahearn | 331/94.5 H |
| 3,878,556 | 4/1975 | Nyul | 331/94.5 H |
| 3,962,556 | 6/1976 | Selway et al. | 331/94.5 H |

OTHER PUBLICATIONS

Ahearn, "Thermal Spacer for Room Temperature Close-PackedGatts Laser Arrays", IBM TDB, vol. 12, No. 12, May 1970, p. 2133.

Primary Examiner—James W. Davie
Attorney, Agent, or Firm—George W. Finch; Donald L. Royer; John P. Scholl

[57] ABSTRACT

A laser diode is soldered between metal plates for intimate thermal and electrical contact. The plates are prefabricated and are provided with an insulated spacer therebetween. The two metal plates are held together in a preferred orientation by the spacer which is firmly adhered and sealed to the two plates during the diode soldering operation. The laser diodes so mounted can be tested in this configuration and after testing are formed into an array by stacking the laser diode subassemblies providing spacer elements therebetween and series contacts from one end to the other of the array so that an array of laser diodes with matched characteristics can be constructed in a line which may not be in alignment with the total package to provide an intense light output at a predetermined wavelength.

10 Claims, 6 Drawing Figures

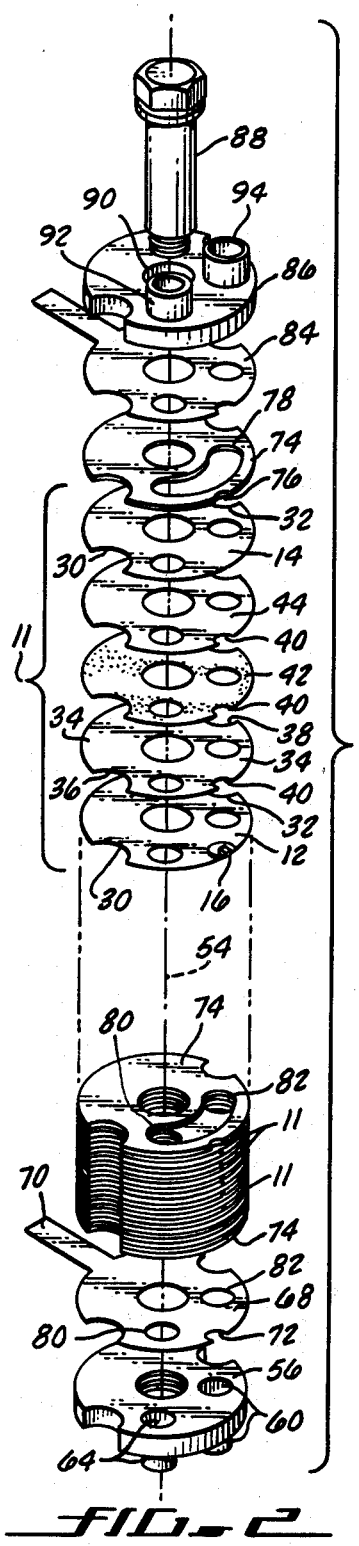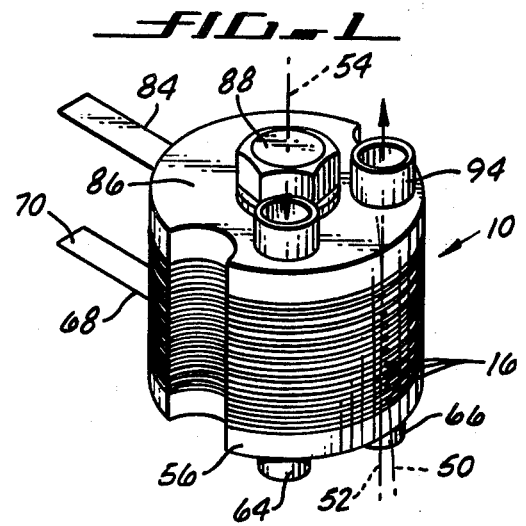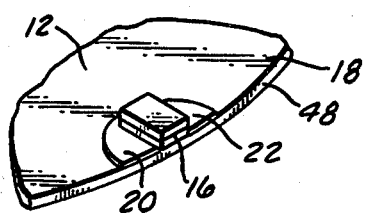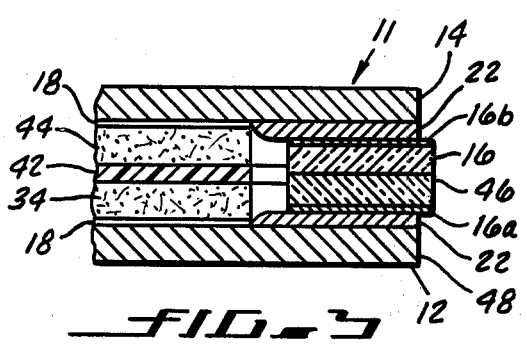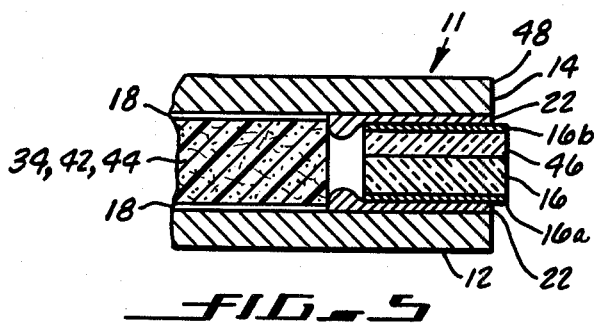

HEAT SINK LASER DIODE ARRAY

BACKGROUND OF THE INVENTION

Injection laser diodes are potentially the most efficient narrow band light sources available. Their small size and high brightness makes them ideally suited for applications as sources in ranging illuminators, fiber optics communications, integrated optics and diode pumping of Nd: YAG lasers, particularly for space applications.

The laser cavity in a laser diode is usually formed by two mirrors at the ends of a semiconductor crystal. Semiconductors usually have a high refractive index, particularly for light of photon energies usually involved in such devices, so that a large enough discontinuity exist between the semiconductor and the surrounding air to form mirrors without any coating. Semiconductor crystals cleave along planes of weakest binding so the mirrors are easily constructed to be perpendicular to the junction in a junction laser diode. A small increase in the refractive index exists in the junction area forming a dielectric waveguide that confines the radiation. In the other direction but transverse to the emission direction, small random variations in refractive index confine the radiation and form it into filaments. Stripe geometry laser diodes have an active region that can be limited to a single filament and, therefore, stripe laser diodes have characteristics that can be reproduced more easily.

Semiconductor laser diodes have numerous advantages. They are small. The dimensions of the active regions thereof typically are submicron to a few microns across with the lengthwise dimension usually no more than a fraction of millimeter. The mirrors are an integral part of the crystal structure and usually are formed by cleaving the crystal so they have high mechanical stability. High efficiencies are possible. Pulsed junction laser diodes have been operated at as much as 40% external quantum efficiency. They are versatile. For example, junction laser diodes conventionally are pumped with direct current and their output can be amplitude, frequency, or pulse position modulated into the GHz range. They can lase at wavelengths from 20 to 0.7 microns with the proper choice of semiconductor alloy and can operate in a single mode. They also can be operated continuously at room temperature. Continuous outputs of as much as 40 mW have been obtained at room temperature with much higher powers at lower temperatures.

Their universal application has been restricted, however, because severe problems have plagued laser diodes users. These problems relate to mounting strain thermal effects caused by the necessarily large heat dissipation per unit area of the diodes, and by the strain induced by thermal cycling. Moreover, laser diode efficiency and device lifetime is markedly decreased by small increases in junction temperature. Effective laser diode use in system applications has required the ability to operate diodes individually or in arrays under optimum and controllable conditions heretofore unavailable. This is because commercially available diodes in arrays use standard headers which neither mechanically yield nor are adaptable for combining matched parameter diodes in high output high density arrays. Lens design and power efficiency in various applications has been difficult because of the less than optimum available mounting configurations. Heretofore available methods for mounting laser diodes do not allow arrays to be built up from selected, parameter matched, quality laser diodes. Overall array efficiency is decreased by this deficiency as much as 50% in output power and with undesirable variations up to 200 A in optical band width. A short lifetime of some of the diodes can also result. Therefore, in addition to a better and more efficient mounting arrangement, there has been a need for a mounting arrangement which allows injection laser diodes to be individually mounted and tested and then configured into an array after selection and matching of the various parameters of the diodes.

BRIEF DESCRIPTION OF THE INVENTION

In the present invention each individual semiconductor laser diode is soldered between metal plates for intimate thermal and electrical contact which decreases electrical resistance and increase thermal dissipation. No wire bonds are used. The metal mounting plates are made thin enough to yield with diode thermal expansion, yet thick enough to provide adequate thermal and electrical capacity. The metal plates are held in relative position by a spacer which is firmly adhered to and seals the two plates together during the soldering operation attaching the laser diode to the metal plates. The use of the metal plates results in better and more symmetric heat sinking and smaller thermal strain in the diode than heretofore has been possible to improve the operation thereof. High speed operation is improved by the low resistance and low inductance contacts provided by the metal plates.

The metal plates are electroplated with solder at selected locations using common photoresist techniques. Sheets of fiber spacer and plastic are placed between the plates in the area outside the electroplated solder area. The plastic is selected to melt at the solder melting temperature so that a single thermal cycle can be used to solder the plates to the diode and to seal the plates together. Photoresist left on the plates provides the adherence quality needed for durability. The plate area is made large enough to adequately heat sink the diode and is properly shaped to perform the function of alignment and cooling when placed in an array.

When it is desired to operate the single mounted diodes in an array, the subassemblies, each formed by a diode and its two heat sink plates, are placed in series with a thermal release spacer therebetween so that an array including a plurality of diodes is constructed. It is preferable that the diodes be pretested so that they all will operate with matched output power and wavelength. The diodes preferably are arranged in the stack such that they are in a straight line even though the line may not be parallel to the axis of the stack. This aligns the fan shaped outputs thereof into a single fan shape to ease the optical problems involved in using the outputs thereof. Contacts are placed at the top and bottom of the array so that electrical energy can be fed to all of the diodes by way of a series connection. More than one array can be placed in a stack to form a larger array made up of smaller sub-arrays. This usually is done to match the array to the power output capacities of available power supplies or to provide an abrupt wavelength change capability. When this is done, insulating spacers are used between the sub-arrays and additional contacts are provided at the ends of the sub-arrays. Mounting plates are placed at the ends of the assembly and an insulated bolt or similar fastener is extended through the assembly to bolt it together. Cooling manifolds normally are provided in these mounting plates and the spacer members heretofore mentioned may include cutouts which allow cross flow of coolant between cutouts in the metal plates used to mount the diodes.

It is therefore an object of the present invention to improve the operation of semiconductor laser diode arrays by providing intimate heat sink contact on both sides of each diode in the array thereof to evenly dissipate the heat generated thereby.

Another object is to provide a diode array which can be operated at high power levels intermittently or can be actively cooled for continuous operation at high power levels.

Another object is to provide a diode array configured so that each laser diode in the array can be tested individually prior to its incorporation into the array.

Another object is to provide a laser diode array which can include any number of a plurality of diodes which is relatively economic and easy to manufacture in a production situation.

Another object is to provide an array of heat sinked laser diodes which can include a plurality of independently controllable sub-arrays.

Another object is to provide a diode array which enables operation with a plurality of laser diodes each having an internal etalon for more precise control of the output bandwidth of the diodes.

These and other objects and advantages of the present invention will become apparent to those skilled in the art after considering the following detailed specification which covers preferred embodiments thereof in conjunction with the accompanying drawings wherein:

BRIEF DESCRIPTION OF THE DRAWINGS

FIG. 1 is a perspective view of an assembled diode array constructed according to the present invention;

FIG. 2 is an enlarged detailed view of a portion of a component of FIG. 1 showing a laser diode mounted thereon;

FIG. 3 is a cross-sectional view through a junction laser diode during its heat sink connection process prior to soldering with surrounding portions of the heat sink mounting shown;

FIG. 4 is a view similar to FIG. 3 after the application of heat to the assembly;

FIG. 5 is a partially exploded view of the components of the array of FIG. 1.

DETAILED DESCRIPTION OF THE SHOWN EMBODIMENT

Figure 6:
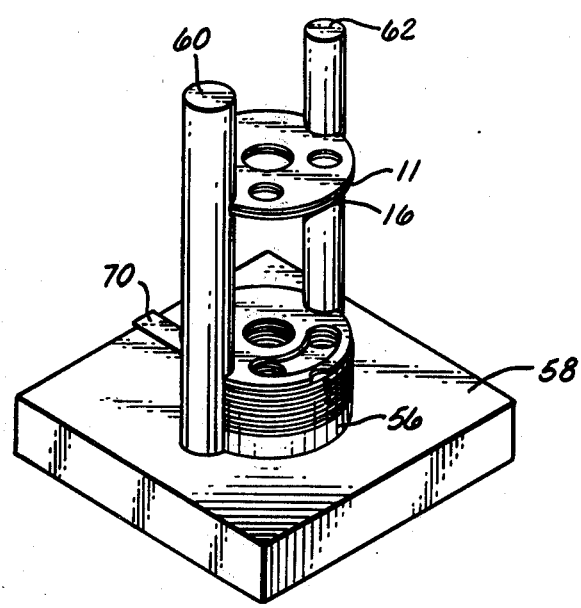
FIG. 6 is perspective view of an array being constructed on a jig from the components shown in FIG. 5.

Referring to the drawings more particularly by reference numbers, number 10 in FIG. 1 refers to a laser diode array constructed according to the present invention. As shown in FIG. 2, the array 10 includes a plurality of laser diode assemblies 11. Each assembly 11 includes a pair of laser diode mounting plates 12 and 14 on which the laser diode 16 eventually is attached by its metal contacts 16a and 16b (FIG. 3). The plates 12 and 14 are shown similarly shaped in the form of circular discs however, a plate of any shape can be used. The plates 12 and 14 preferably are constructed from a good heat conducting material such as copper which has been goldplated on its surfaces to assure good electrical contact. The plates 12 and 14 are coated with photo resist layers 18 except for the diode mounting area 20 which thereafter is coated with indium solder to form a mounting pad 22.

When it is desired to mount a diode 16, the plate 12 is placed on a mounting jig, not shown, having two upstanding pins of different diameters which fit in indexing cutouts 30 and 32 provided in the edge of the plate 12, a plastic filler sheet 34 having indexing cutouts 36 and 38 similar to cutouts 30 and 32 and a diode relief cutout 40 is then placed on the plate 12. This is followed by a fiber spacer 42 and another plastic filler sheet 44 each having the same shape as the filler sheet 34. Polyethylene is a suitable plastic for the filler layers 34 and 44 and lens paper suitable for the spacer 42. The thicknesses of the filler sheets 34 and 44 and the fiber spacer 42 are chosen to match the thickness of the soldered diode 16. The mounting plate 14 having cutouts 30 and 32 like plate 12, thereafter is placed on the plastic filler sheet 44. The assembly 11 so formed is then heated evenly to simultaneously solder the diode 16 to the metal mounting plates 12 and 14 and to melt the plastic filler sheets 34 and 44 into the fiber spacer 42 as shown in FIG. 5. The plastic adheres to the photo resist layers 18 to hold assembly 11 together. Depending upon the thickness of the diode 16, a suitable number of plastic filler layers and fiber spacers are used so that the plates 12 and 14 are essentially parallel in the assembly 11. It should be noted that the diode 16 is oriented with respect to the plates 12 and 14 so that its output end 46 extends slightly beyond the edge 48 of the assembly 11. This is to prevent diffraction effects from disturbing the output of the diode 16.

When so mounted in the assembly 11, individual diodes 16 can be tested by applying electrical current of proper polarity between the plates 12 and 14. In this way, diodes having similar output wavelengths can be selected and their exact positioning with respect to the cutouts can also be determined. This enables the matching of diodes 16 in a particular array 10 for their wavelength characteristics and also enables them to aligned in a line 50 so that the problem of adjacent optics is considerably simplified. The line 50 as shown in FIG. 1 in most instances is not parallel to the line 52 parallel to the axis 54 of the array. However, by knowing the amount of offset between lines 50 and 52, the array 10 can be mounted at a slight angle so that the line 50 of diodes 16 is properly positioned to provide the desired output.

The array 10 is assembled as shown in FIG. 6 by placing an array baseplate 56 on a mounting jig 58 having two alignment pins 60 and 62. The alignment pins 60 and 62 preferably are of different diameters so that cutouts having different diameters can be used on the assemblies 11 to assure that the assemblies 11 are stacked in the array with proper polarity. The mounting plate 56 preferably is shaped similarly to the plates 12 and 14 and is shown also including coolant manifolds 64 and 66. A contact member 68 having a contact tab 70 is then placed on the jig 58. It should be noted that the contact member 68 also includes a cutout 72 in alignment with the solder pads 22 of the plates 12 and 14 to provide thermal relief.

Thereafter, a relatively thick spacer member 74 is placed on the plate 68. In addition to a thermal relief cutout 76, similar to the thermal relief cutout 72, the spacer 74 includes a cross flow channel 78 for coolant. As can be seen by reference to FIG. 2, the contact member 68 and the assembly 11 have a pair of passageways 80 and 82 therethrough which are positioned in alignment with the manifolds 64 and 66 of the plate 56. The passageways 80 and 82 allow coolant to flow through the array and the cross flow channel 78 enables this coolant to contact the metal plates 12 and 14 adjacent the diode 16 to assure efficient cooling thereof.

Once a suitable number of assemblies 11 are stacked with the spacer members on each side thereof, a second contact member 84 similar to contact member 68 is applied to the top spacer member 74 so that a potential can be applied across all of the assemblies 11 in the array 10. A second endplate 86 which may be similar to the end plate 56 then is placed on top of the contact member 84 and an insulated bolt 88 is positioned through a hole 90 centrally formed through the array 10 and is threaded into the plate member 56. It should be noted that plate 86 also includes coolant manifolds 92 and 94. This arrangement enables flow to be controlled through the array 10 in any predetermined manner. For example, coolant may be introduced into manifolds 64 and 92 and removed through manifolds 66 and 94 or manifolds 94 and 64 may be plugged with coolant being introduced through manifold 92 and removed through manifold 66. It is also possible to plug both manifolds in one of the plates 56 and 66 and use the two manifolds in the other plate as input and output ports for coolant. When liquid coolant is used, it is preferable that the spacers 74 be constructed from a compliant material such as solder which will seal the passageways 80 and 82 between adjacent assemblies 11. This sealing is not required when cooling gasses are used, however, since a little leakage about the spacer members 74 can actually improve diode cooling.

Thus there has been shown and described a novel heat sink laser diode array which fulfills all the objects and advantages sought therefore. Many changes, modifications, variations, alterations and other uses and applications of the subject diode array will become apparent to those skilled in the art after considering the following detailed specification and drawings. All such changes, modifications, variations and other uses and applications which do not depart from the spirit and scope of the invention are deemed to be covered by the invention which is limited only by the claims which follow.

What is claimed is:

1. An array of heat sink mounted laser diodes including:
   at least two heat sink mounted laser diode assemblies, each assembly being comprised of first and second mounting plates of a predetermined shape, each mounting plate having a solder pad of a predetermined shape thereon, a laser diode soldered between said first and second mounting plates to said solder pads, at least one spacer positioned between said mounting plates having a shape similar to said predetermined shape of said mounting plates and in addition having a cutout adjacent said solder pads, adhesive to retain said spacer to said mounting plates, orienting means and means for conducting coolant;
   a heat sink mounted laser diode assembly spacer positioned between said first and second mounting plates of adjacent assemblies, said heat sink mounted laser diode assembly spacer including means for conducting coolant between said adjacent assemblies;
   first and second contact plates, said first contact plate being positioned in electrical communication with said first mounting plate of one of said assemblies and said second contact plate being positioned in electrical communication with said second mounting plate of another one of said assemblies to form a series circuit to feed electrical power to said laser diodes; and
   means to retain said array in a unitary structure.

2. The array as defined in claim 1 wherein said means to retain said array in a unitary structure include:
   first and second end plates defining a fastener hole therethrough positioned about said first and second contact plates opposite from said assemblies; and
   a fastener, said assemblies, assembly spacers, and contact plates defining a fastener hole therethrough in alignment with said defined fastener holes in said first and second end plates through which said fastener extends to hold said first and second end plates about said array.

3. The array as defined in claim 2 wherein said fastener is electrically insolated from said first end plate.

4. The array as defined in claim 3 wherein said second end plate includes threads in the fastener hole defined therein, said fastener including threads for engagement with said fastener hole threads.

5. The array as defined in claim 1 wherein said orienting means of said assemblies include first and second cutouts, said first and second cutouts being different and said diodes being mounted with similar relative positioning from said first and second cutouts.

6. The array as defined in claim 5 wherein said assemblies are stacked in said array so that said diodes are positioned along a diode line when said first and second cutouts are aligned.

7. The array as defined in claim 6 wherein said assemblies are generally circular and disc shaped, said assemblies when stacked into said array defining a central axis thereof and said first and second cutouts are semicircular in shape and have different radii so that the proper polarity of said diodes in said array can be determined.

8. The array as defined in claim 7 wherein said diode line is offset from a line parallel to said axis of said array.

9. An array of heat sink mounted laser diodes including:
   at least two heat sink mounted laser diode assemblies, each assembly being comprised of first and second mounting plates of a predetermined shape, each mounting plate having a solder pad of a predetermined shape thereon, a laser diode soldered between said first and second mounting plates to said solder pads, at least one spacer positioned between said mounting plates having a shape similar to said predetermined shape of said mounting plates and in addition having a cutout adjacent said solder pads, adhesive to retain said spacer to said mounting plates, and orienting means;
   a heat sink mounted laser diode assembly spacer positioned between said first and second mounting plates of adjacent assemblies, said heat sink mounted laser diode assembly spacer including means for conducting coolant between said adjacent assemblies;
   first and second contact plates, said first contact plate being positioned in electrical communication with said first mounting plate of one of said assemblies and said second contact plate being positioned in electrical communication with said second mounting plate of another one of said assemblies to form a series circuit to feed electrical power to said laser diodes; and means to retain said array in a unitary structure including first and second end plates defining a fastener hole therethrough positioned about said first and second contact plates opposite from said assemblies, at least said first end plate including at least two coolant manifolds through which coolant can be fed, said first and second mounting plates and said spacer defining at least one coolant passageway therethrough adjacent said laser diode, said at least one coolant passageway being connected to said at least two coolant manifolds, and a fastener, said assemblies, assembly spacers, and contact plates defining a fastener hole therethrough in alignment with said defined fastener holes in said first and second end plates through which said fastener extends to hold said first and second end plates about said array.

10. An array of heat sink mounted laser diodes including:

at least two heat sink mounted laser diode assemblies, each assembly being comprised of first and second mounting plates of a predetermined shape, each mounting plate having a solder pad of a predetermined shape thereon, a laser diode soldered between said first and second mounting plates to said solder pads, at least one spacer positioned between said mounting plates having a shape similar to said predetermined shape of said mounting plates and in addition having a cutout adjacent said solder pads, adhesive to retain said spacer to said mounting plates, and orienting means;

a heat sink mounted laser diode assembly spacer positioned between said first and second mounting plates of adjacent assemblies, said heat sink mounted laser diode assembly spacer including means for conducting coolant between said adjacent assemblies;

first and second contact plates, said first contact plate being positioned in electrical communication with said first mounting plate of one of said assemblies and said second contact plate being positioned in electrical communication with said second mounting plate of another one of said assemblies to form a series circuit to feed electrical power to said laser diodes; and means to retain said array in a unitary structure including first and second end plates defining a fastener hole therethrough positioned about said first and second contact plates opposite from said assemblies, said first and second end plates each include at least one coolant manifold, said first and second mounting plates and said spacer defining at least one coolant passageway therethrough adjacent said laser diode, said at least one coolant passageway being connected to said at least one coolant manifold of both first and second end plates, and a fastener, said assemblies, assembly spacers, and contact plates defining a fastener hole therethrough in alignment with said defined fastener holes in said first and second end plates through which said fastener extends to hold said first and second end plates about said array.

* * * * *